United States Patent [19]

Pfau et al.

[11] 4,287,537
[45] Sep. 1, 1981

[54] METHOD OF REPRODUCING GRAPHIC MATERIAL ON AN INTAGLIO FORM

[75] Inventors: Paul Pfau, Essen; Thomas E. Fausel; Arthur Grunder, both of Ostfildern, all of Fed. Rep. of Germany

[73] Assignee: Simom S.A., Zug, Switzerland

[21] Appl. No.: 10,994

[22] Filed: Feb. 9, 1979

[30] Foreign Application Priority Data

Feb. 11, 1978 [DE] Fed. Rep. of Germany ....... 2805874

[51] Int. Cl.³ .............................................. H04N 1/22
[52] U.S. Cl. .................................................... 358/299
[58] Field of Search .............. 358/296, 297, 298, 299, 358/302, 283; 430/293, 307

[56] References Cited

U.S. PATENT DOCUMENTS

| 2,925,464 | 2/1960 | Raible | 358/299 |
| 3,461,229 | 8/1969 | Oppenheimer | 358/297 X |
| 3,961,132 | 6/1976 | Landsman | 358/283 |
| 4,108,659 | 8/1978 | Dini | 358/299 X |

Primary Examiner—Bernard Konick
Assistant Examiner—Donald McElheny, Jr.
Attorney, Agent, or Firm—Karl F. Ross

[57] ABSTRACT

Copy to be transferred to an intaglio form for printing is first photolithographically reproduced as a basic discontinuous-tone image which is then photoelectrically scanned and converted into a dot pattern by computerized engraving of an intaglio-printing surface. The engraving may be carried out mechanically or by inscribing the dot pattern on a film with the aid of a laser and then projecting it onto a pigment carrier to produce a latent image upon which a blurred halftone replica of the basic image is superimposed to extend the tonal range by selectively deepening the pits subsequently etched into the printing surface.

5 Claims, 1 Drawing Figure

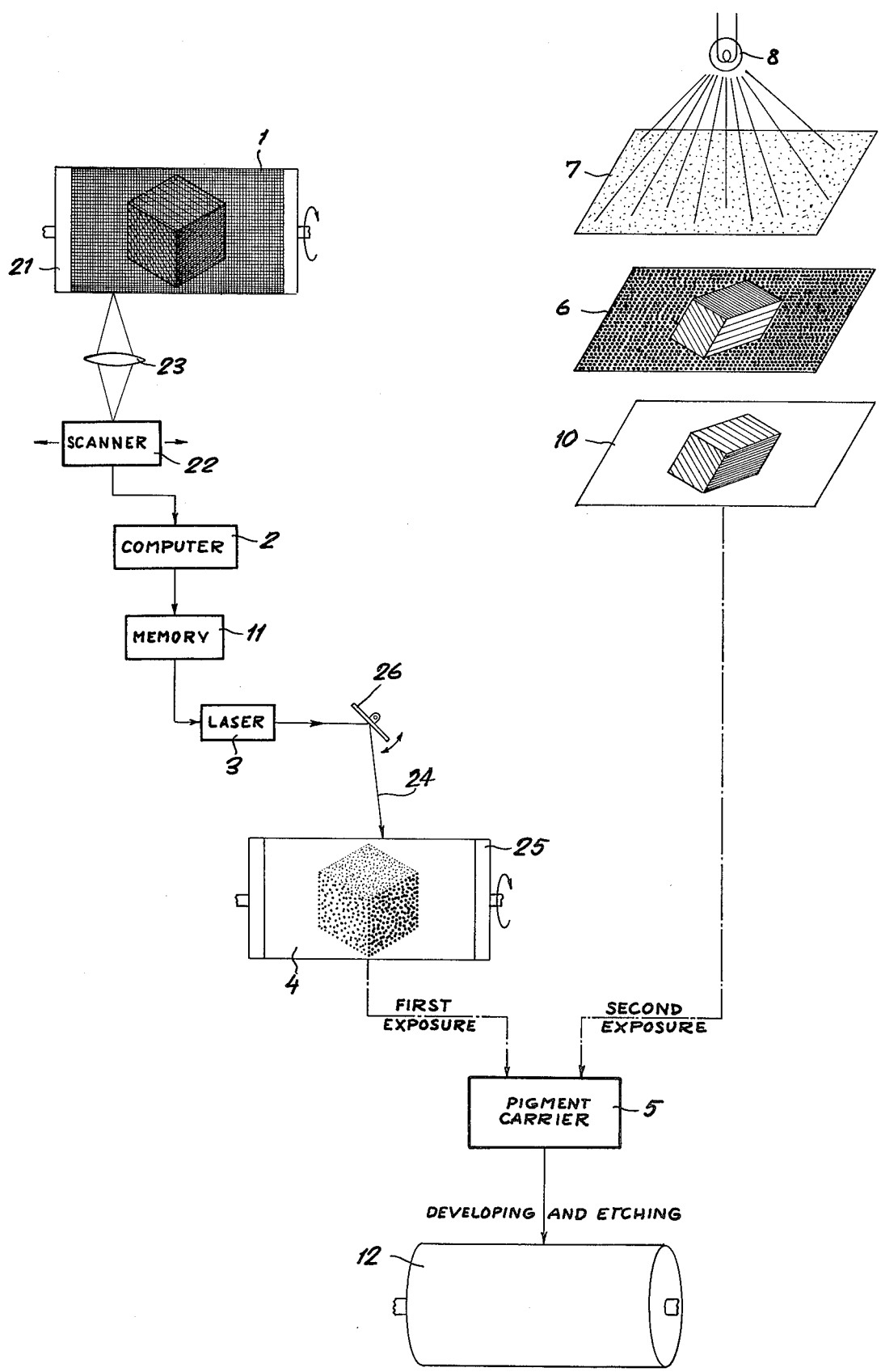

METHOD OF REPRODUCING GRAPHIC MATERIAL ON AN INTAGLIO FORM

FIELD OF THE INVENTION

Our present invention relates to a method of reproducing graphic material, referred to in the art as copy, on an intaglio form for printing.

BACKGROUND OF THE INVENTION

Intaglio forms are conventionally prepared by mechanically engraving or chemically etching an array of dots into a printing surface of a flat or cylindrical platen, the dots having the shape of wells or pits which are filled with ink to be transferred to a sheet to be printed. The pits vary in diameter and/or depth to produce different tonal values, i.e. shades of gray or other color used for printing. In photoengraving, a positive replica of the copy to be reproduced is projecting through a halftone screen upon a pigment carrier, such as a sensitized gelatin film known in the art as carbon tissue, to create a latent image consisting of a multiplicity of discontinuous elemental areas subjected to different degrees of illumination. (The halftone screen may also be imaged upon the pigment carrier in a separate operation.) The pigment carrier, placed on a printing platen such as a copper cylinder, is washed with water to develop the latent picture and is thus tranformed into a masking layer enabling selective etching of the metallic substrate through its pattern of thickness variations.

A continuous-tone positive used for illuminating the pigment carrier is generally obtained by taking a negative of the original graphic material and photographically inverting that negative. Both the right-reading halftone negative and the laterally reversed halftone positive usually require retouching, which is a time-consuming operation particularly when several negatives and positives are required for multicolor printing.

More recent developments include the photoelectric scanning of the copy to be reproduced and the conversion of the resulting signals, with the aid of a computer, into binary pulses which are subsequently recorded on a film as a two-dimensional dot pattern to be used for producing the latent image on the pigment carrier. For this purpose, the film is swept by a laser beam which is modulated by the binary pulses read out from a data store in the computer, possibly with intermediate storage of these pulses in a memory. The digital coding of the dot pattern results in a sharper outline for the dots so as to make the halftone image less sensitive to fluctuations in developing time and temperature.

The intaglio process provides a high degree of contrast and a wide range of tonal values capable of forming colorful, high-quality reproductions of all types of paintings and original photographs. This technique is therefore widely utilized for art books, picture magazines, mail-order brochures and the like. A drawback, aside from the aformentioned laborious retouching operations, is the lack of a quick and inexpensive way of making advance proofs, such as those obtainable with planographic processes, which would enable the operator to correct or otherwise modify the copy before the etching step.

OBJECTS OF THE INVENTION

An object of our present invention, therefore, is to provide an improved method of preparing intaglio-printing surfaces which obviates the aforestated drawbacks.

A related object is to provide a printing method which combines the advantages of planographic techniques such as offset printing with those of the photoengraving process.

SUMMARY OF THE INVENTION

In accordance wtih our present invention, we first prepare a basic planographic halftone image from the copy to be reproduced, i.e. an image divided into a multiplicity of disjointed elemental areas of different tonal values. These elemental areas are then converted into an array of dots, varying in width with their tonal values, which are subsequently engraved on a printing surface either mechanically or by etching (preferably the latter).

The elemental areas of the basic halftone image need not necessarily form a regular pattern defined, for example, by orthogonally intersecting lines. Thus, the basic image may be produced in a variety of ways including lithography, screen printing and letterpress printing. We prefer to use an offset halftone positive or negative which, upon photoelectric scanning, gives rise to a train of amplitude-modulated analog pulses that are then converted, in the aforedescribed manner known per se, into binary pulse codes for the modulation of a laser beam or for the control of an engraving tool. Proofs drawn from the basic image can be inspected to determine whether there is a need for changing the layout of the copy before the platen constituting the intaglio form is engraved; though these proofs lack the tonal intensity of an intaglio print, they faithfully represent the two-dimensional aspect of the printing surface to be formed.

A photoengraving technique known as the Dultgen halftone intaglio process uses two exposures of the pigment carrier, one with and the other without a halftone screen, to produce an array of dots varying not only in width but also in depth so as to extend the range of tonal values to be reproduced. In accordance with a more particular aspect of our invention, such a double exposure can be carried out by projecting a blurred replica of the basic image upon the pigment carrier so as to superimpose the image of that replica upon the latent image of the laser-generated dot pattern. The blurred replica, in which the grid of the offset halftone is suppressed, can be obtained by transluminating a photographic inversion of the basic image, i.e. a negative in the case of a basic positive or vice versa, with diffused light or by scattering the light rays which pass through or are reflected from the inverted image. Such a blurred replica may also be produced with the aid of a television camera having a defocused beam.

The procedure according to our invention can, of course, be employed for the reproduction of individual color patterns of a multicolor image. The electronic generation of the halftone pattern avoids the objectionable moire effects frequently encountered in color printing.

BRIEF DESCRIPTION OF THE DRAWING

Our invention will now be described in greater detail with reference to the accompanying drawing the sole FIGURE of which schematically illustrates a preferred embodiment.

SPECIFIC DESCRIPTION

In the drawing we have shown a basic planographic halftone image 1 of graphic material to be reproduced, specifically an offset positive print photographed through a halftone screen, which is mounted on a rotating cylinder 21 scanned by a photoelectric transducer 22 through a lens 23. Scanner 22 and lens 23 may be advanced in steps, after each revolution of cylinder 21, in a direction parallel to the cylinder axis to explore the entire image, generating a train of analog pulses fed to a computer 2 along with position or synchronizing signals from a nonillustrated motion controller. The program store of computer 2 contains the binary codes corresponding to the various tonal values picked up by the scanner 22 from each elemental area of image 1. These binary codes are stored in a memory 11, together with the accompanying position signals, for subsequent delivery to a laser 3 whose beam 24 is modulated in intensity while being trained upon a film 4 on another cylinder 25 whose rotary speed is controlled by the position signals. A reflector 26 controls the sweep of the beam 24 across the surface of film 4, also in response to the stored position signals, to produce a dot pattern which, after developing of the film, has a density profile corresponding to the distribution of the tonal values on the basic image 1. If the pulse codes from computer 2 are directly read out to the laser 3, with omission of memory 11, the two cylinders 21 and 25 will be rotated in unison and the beam deflector 26 will be coupled with the drive of scanner 22 to obviate the need for position signals.

The developed film 4 is projected episcopically or by translumination, i.e. by reflected or throughgoing light, upon a pigment carrier 5 in a first exposure step, followed by a second exposure of that carrier to a blurred replica 10 of image 1 produced by photocopying a negative 6 of image 1 with diffused light obtained from a lamp 8 via a translucent foil 7. The sequence of the two exposures could also be reversed. The exposed pigment carrier 5 is then mounted on a cylindrical platen 12 for developing and etching in the conventional manner. A negative of film 4 could be used in lieu of offset negative 6 to produce the image replica 10.

The pulse codes read out from computer 2 or stored in memory 11 could also be used to control a mechanical engraving tool cutting a dot pattern into a printing surface. Alternatively, these pulse codes can be utilized for direct control of the illumination of pigment carrier 5, without the intermediary of film 4; the pigment carrier may, for this purpose, be mounted on a drum such as cylinder 25 swept by the laser beam 24.

The blurring of the halftone image used for the second exposure of the pigment carrier is, of course, carried only far enough to obliterate the grid of the original halftone screen, if the negative 6 is used, or to let the dots merge into one another when a negative of film 4 is utilized as a replica. When the transparency 6 constitutes a negative image of the copy to be reproduced, as is the case in the embodiment specifically illustrated, the diffusion of the light rays tends to broaden the original dark or color-intensive lines and areas by uniform linear increments. When the basic image is a negative (with corresponding modification of the pulse codes stored in the computer), its darker lines and areas are correspondingly thinned on the replica which in this case will have to be photocopied once more to provide a positive usable for the second exposure of the pigment carrier.

We claim:

1. A method of reproducing copy on a printing surface, comprising the steps of:
    preparing a basic planographic halftone image from the copy to be reproduced, said basic image being divided into a multiplicity of disjointed elemental areas of different tonal values;
    photoelectrically scanning said basic image to generate a train of analog pulses varying in amplitude with the tonal values of said elemental areas;
    transforming said analog pulses into binary pulse codes;
    sweeping a laser beam, modulated by said binary pulse codes, across a photosensitive film to form an intermediate dot pattern thereon;
    projecting the dot pattern from said film onto a photosensitive pigment carrier to produce thereon a latent image forming a masking layer upon development of said carrier; and
    etching said printing surface through said masking layer, thereby producing an array of dots conforming to said pattern.

2. A method as defined in claim 1 wherein said basic image is prepared by halftoning an offset print.

3. A method as defined in claim 1, comprising the further step of pulling an advance proof from said basic image before the etching of said printing surface.

4. A method as defined in claim 1, 2 or 3 comprising the further step of superimposing a blurred halftone replica of said basic image upon the latent image of said array of dots before developing said pigment carrier.

5. A method as defined in claim 4 wherein said blurred halftone replica is derived from a photographic inversion of said basic image.

* * * * *

REEXAMINATION CERTIFICATE (87th)

United States Patent [19]
Pfau et al.

[11] B1 4,287,537
[45] Certificate Issued  May 24, 1983

[54] METHOD OF REPRODUCING GRAPHIC MATERIAL ON AN INTAGLIO FORM

[75] Inventors: Paul Pfau, Essen; Thomas E. Fausel; Arthur Grunder, both of Ostfildern, all of Fed. Rep. of Germany

[73] Assignee: Simom S. A., Zug, Switzerland

Reexamination Request
No. 90/000,232, Jul. 28, 1982

Reexamination Certificate for:
Patent No.: 4,287,537
Issued: Sep. 1, 1981
Appl. No.: 10,994
Filed: Feb. 9, 1979

[30] Foreign Application Priority Data
Feb. 11, 1978 [DE] Fed. Rep. of Germany .... 2805874

[51] Int. Cl.³ .......................................... H04N 1/26
[52] U.S. Cl. ................................................. 358/299
[58] Field of Search ... 358/283, 296, 297, 298, 299; 358/302; 430/293, 307

[56] References Cited

U.S. PATENT DOCUMENTS

| | | |
|---|---|---|
| 2,096,794 | 10/1937 | Dultgen. |
| 2,543,393 | 2/1951 | Wheldon. |
| 3,725,574 | 4/1973 | Gast. |

FOREIGN PATENT DOCUMENTS

| | | |
|---|---|---|
| 1242098 | 6/1967 | Fed. Rep. of Germany. |
| 0706688 | 4/1954 | United Kingdom. |
| 0706689 | 4/1954 | United Kingdom. |

OTHER PUBLICATIONS

Gravure Research Institute Report No. M-97, "Revival of Gravure Conversion Using Fast Offset Techniques to Cut Costs", presented at the Gravure Research Institute 30th Annual Meeting November 9-12, 1977.

Gravure Technical Association Bulletin, volume IV, No. 2, December, 1953, "Convertype", p. 48.

Gravure Technical Association Bulletin, volume XIV, No. 1, February, 1963, "Conversions", pp. 41–43.

Gravure, November, 1963, "Conversions Letterpress to Gravure", pp. 24 and 27.

Gravure, February, 1965 "ConverLOG" by Frank A. Sportelli.

*Primary Examiner*—R. F. Cardillo, Jr.

[57] ABSTRACT

Copy to be transferred to an intaglio form for printing is first photolithographically reproduced as a basic discontinuous-tone image which is then photoelectrically scanned and converted into a dot pattern by computerized engraving of an intaglio-printing surface. The engraving may be carried out mechanically or by inscribing the dot pattern on a film with the aid of a laser and then projecting it onto a pigment carrier to produce a latent image upon which a blurred halftone replica of the basic image is superimposed to extend the tonal range by selectively deepening the pits subsequently etched into the printing surface.

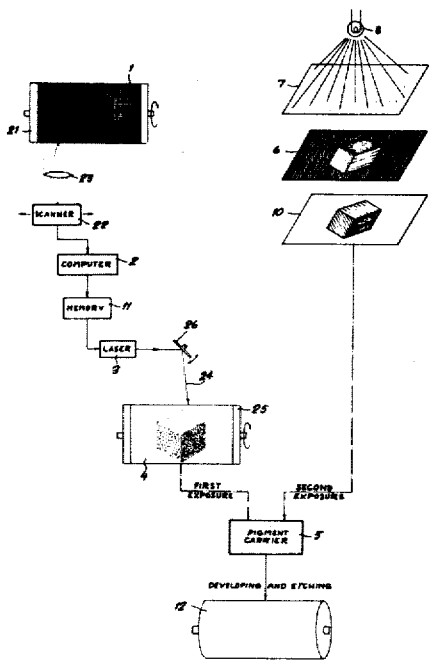

REEXAMINATION CERTIFICATE ISSUED UNDER 35 U.S.C. 307.

NO AMENDMENTS HAVE BEEN MADE TO THE PATENT.

AS A RESULT OF REEXAMINATION, IT HAS BEEN DETERMINED THAT:

The patentability of claims 1-5 is confirmed.

* * * * *